(12) United States Patent
Borthakur et al.

(10) Patent No.: US 10,622,391 B2
(45) Date of Patent: *Apr. 14, 2020

(54) IMAGING SYSTEMS WITH THROUGH-OXIDE VIA CONNECTIONS

(71) Applicant: SEMICONDUCTOR COMPONENTS INDUSTRIES, LLC, Phoenix, AZ (US)

(72) Inventors: Swarnal Borthakur, Boise, ID (US); Vladimir Korobov, San Mateo, CA (US); Marc Sulfridge, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 238 days.

This patent is subject to a terminal disclaimer.

(21) Appl. No.: 15/453,038

(22) Filed: Mar. 8, 2017

(65) Prior Publication Data
US 2017/0179176 A1    Jun. 22, 2017

Related U.S. Application Data

(63) Continuation of application No. 14/191,965, filed on Feb. 27, 2014, now Pat. No. 9,679,936.

(51) Int. Cl.
*H01L 27/146* (2006.01)
*H01L 21/768* (2006.01)
(Continued)

(52) U.S. Cl.
CPC .. *H01L 27/14618* (2013.01); *H01L 21/76224* (2013.01); *H01L 21/76898* (2013.01);
(Continued)

(58) Field of Classification Search
CPC .......... H01L 27/14618; H01L 27/1469; H01L 27/14687; H01L 27/14634; H01L 27/14636
See application file for complete search history.

(56) References Cited

U.S. PATENT DOCUMENTS 8,373,243 B2   2/2013  Tai et al.
8,497,536 B2   7/2013  Chen et al.
(Continued)

FOREIGN PATENT DOCUMENTS

CN     101110438 A    1/2008
CN     101165894 A    4/2008
(Continued)

*Primary Examiner* — Padma Haliyur
(74) *Attorney, Agent, or Firm* — Treyz Law Group, P.C.; Tianyi He

(57) ABSTRACT

An imaging system may include an image sensor package with through-oxide via connections between the image sensor die and the digital signal processing die in the image sensor package. The image sensor die and the digital signal processing die may be attached to each other. The through-oxide via may connect a bond pad on the image sensor die with metal routing paths in the image sensor and digital signal processing dies. The through-oxide via may simultaneously couple the image sensor die to the digital signal processing die. The through-oxide via may be formed through a shallow trench isolation structure in the image sensor die. The through-oxide via may be formed through selective etching of the image sensor and digital signal processing dies.

14 Claims, 4 Drawing Sheets

(51) Int. Cl.
  *H01L 21/762* (2006.01)
  *H04N 5/335* (2011.01)
(52) U.S. Cl.
  CPC .... *H01L 27/1469* (2013.01); *H01L 27/14634* (2013.01); *H01L 27/14636* (2013.01); *H01L 27/14687* (2013.01); *H04N 5/335* (2013.01)

(56) References Cited

U.S. PATENT DOCUMENTS

| | | |
|---|---|---|
| 8,597,074 B2 | 12/2013 | Farnworth et al. |
| 2006/0289733 A1 | 12/2006 | Zung et al. |
| 2007/0007639 A1 | 1/2007 | Fukazawa |
| 2009/0189238 A1 | 7/2009 | Kirby et al. |
| 2011/0049336 A1 | 3/2011 | Matsunuma |
| 2011/0096215 A1 | 4/2011 | Choi et al. |
| 2011/0227186 A1 | 9/2011 | Chang et al. |
| 2011/0233702 A1 | 9/2011 | Takahashi et al. |
| 2012/0105696 A1 | 5/2012 | Maeda |
| 2012/0168935 A1 | 7/2012 | Huang |
| 2012/0175731 A1 | 7/2012 | Chen et al. |
| 2012/0256319 A1 | 10/2012 | Mitsuhashi |
| 2012/0292730 A1 | 11/2012 | Tsai et al. |
| 2013/0068929 A1 | 3/2013 | Solhusvik et al. |
| 2013/0070109 A1 | 3/2013 | Gove et al. |
| 2013/0221470 A1 | 8/2013 | Kinsman et al. |
| 2013/0284885 A1 | 10/2013 | Chen et al. |
| 2014/0015084 A1 | 1/2014 | Chen et al. |
| 2014/0055654 A1 | 2/2014 | Borthakur et al. |
| 2014/0264719 A1 | 9/2014 | Chou et al. |

FOREIGN PATENT DOCUMENTS

| | | |
|---|---|---|
| EP | 2230691 A2 | 9/2010 |
| JP | 2002314866 | 10/2002 |

IMAGING SYSTEMS WITH THROUGH-OXIDE VIA CONNECTIONS

This application is a continuation of U.S. patent application Ser. No. 14/191,965, filed Feb. 27, 2014, which is hereby incorporated by reference herein in its entirety. This application claims the benefit of and claims priority to U.S. patent application Ser. No. 14/191,965, filed Feb. 27, 2014.

BACKGROUND

This relates generally to imaging systems, and more particularly, to imaging systems with through-oxide vias in first and second integrated circuit dies.

Modern electronic devices such as cellular telephones, cameras, and computers often use digital image sensors. Imaging systems (i.e., image sensors) often include a two-dimensional array of image sensing pixels. Each pixel typically includes a photosensor such as a photodiode that receives incident photons (light) and converts the photons into electrical signals. The imaging system contains an image sensor die with an image sensor integrated circuit and an array of photodiodes. The image sensor die is attached to a digital signal processing die with a digital signal processing integrated circuit.

A bond pad on the image sensor die may be coupled to the image sensor integrated circuit and the digital signal processing integrated circuit using vias. However, the amount of time, space, efficiency, and cost for forming via connections between the metal routing paths in the integrated circuits may be limited. In conventional imaging systems, forming a through-silicon via to connect the image sensor die to the bond pad and forming connections from the bond pad to the digital signal processing die can limit the amount of time, space, efficiency, and cost for forming these connections.

It would therefore be desirable to provide improved ways of forming via connections in imaging systems.

DETAILED DESCRIPTION

Electronic devices such as digital cameras, computers, cellular telephones, and other electronic devices include image sensors that gather incoming image light to capture an image. The image sensors may include arrays of imaging pixels. The pixels in the image sensors may include photosensitive elements such as photodiodes that convert the incoming image light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the imaging pixels and readout circuitry for reading out image signals corresponding to the electric charge generated by the photosensitive elements.

Figure 1:
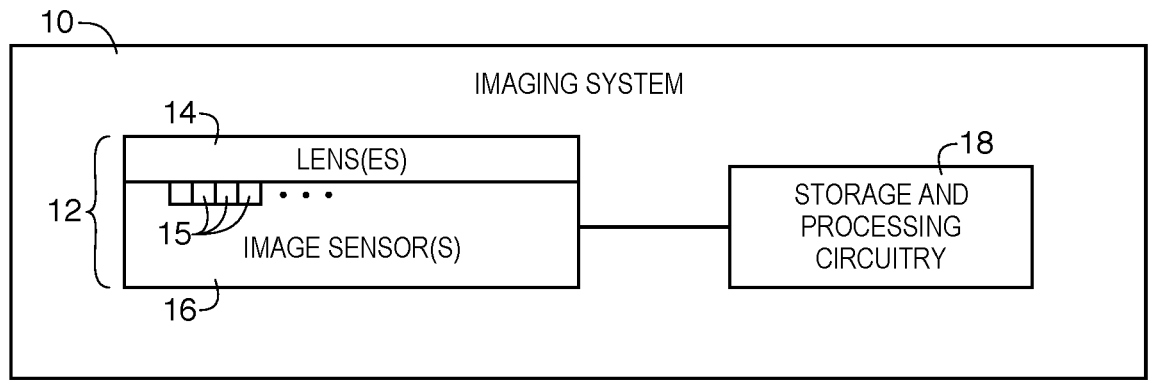
FIG. 1 is a diagram of an illustrative imaging system that may include a camera module having an image sensor in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 provides corresponding digital image data to processing circuitry 18. Image sensor 16 may, for example, be a backside illumination image sensor. If desired, camera module 12 may be provided with an array of lenses 14 and an array of corresponding image sensors 16. Image sensor 16 may include an array of image sensor pixels such as an array of image sensor pixels 15 and a corresponding array of color filter elements.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
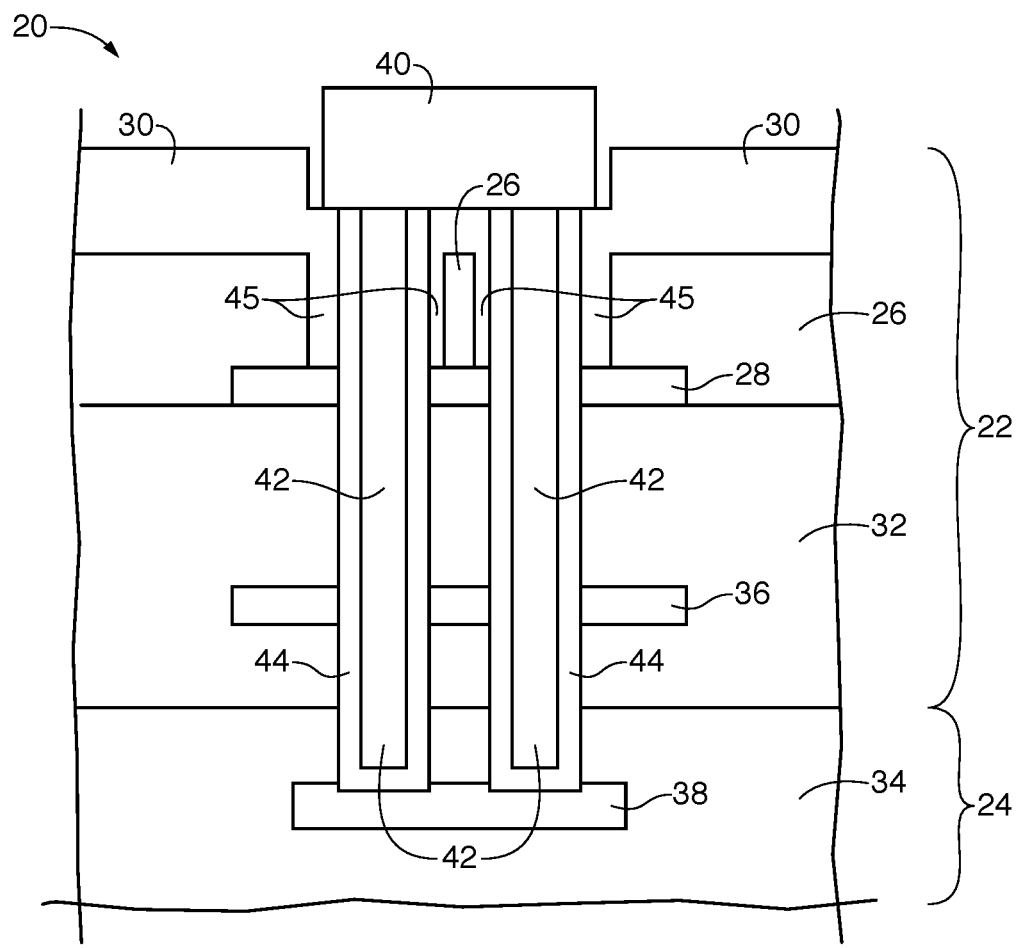
FIG. 2 is a cross-sectional side view of an image sensor package having through-oxide vias in accordance with an embodiment of the present invention.

FIG. 2 is a cross-sectional side view of an image sensor package such as image sensor package 20. Image sensor package 20 may have an image sensor integrated circuit die such as image sensor integrated circuit die 22 (also referred to as image sensor die 22) and a digital signal processing (DSP) integrated circuit die 24 (also referred to as DSP die 24). Image sensor die 22 may contain integrated circuits for an array of image sensor pixels 15 (see, e.g. FIG. 1) in a silicon substrate such as silicon substrate 26. Silicon substrate 26 may have shallow trench isolation (STI) structures such as STI structure 28 that separate the flow of current between adjacent transistors in the image sensor die. STI structure 28 may be formed from oxide materials.

A buffer layer such as buffer layer 30 may be deposited over silicon substrate 26. Buffer layer 30 may be formed from multiple layers of buffer materials such as oxides. Image sensor die 22 may have interconnect layers such as interconnect layers 32. DSP die 24 may also have interconnect layers such as interconnect layers 34. Image sensor die 22 may be bonded or attached to DSP die 24 such that interconnect layers 32 and 34 are facing each other. Interconnect layers 32 may form the front side of image sensor die 22 and interconnect layers 32 may form the front side of DSP die 24. Image sensor package 20 may form part of a backside illumination imaging system, where light is received from the direction of the backside of the image sensor die 22 (e.g. from the side with buffer layer 30). The arrangement in FIG. 2 is merely exemplary; image sensor package 20 may also form part of a frontside illumination system. Image sensor die 22 and DSP die 24 may be attached in any suitable way to form the imaging system.

Interconnect layer 32 may have metal interconnects (e.g. metal routing paths) such as metal interconnects 36. Interconnect layer 34 may have metal interconnects such as metal interconnects 38. Interconnect layers 32 and 34 may be formed from multiple layers of materials and contain multiple layers of metal interconnects. A bond pad such as bond pad 40 may be formed on a passivation layer over silicon substrate 26. Bond pad 40 may be formed from aluminum. There may be more than one bond pad such as bond pad 40 on the surface of silicon substrate 26. Bond pad 40 may have a rectangular or square-shaped surface with four sides. Bond pad 40 may have an area that is smaller than that of a bond pad that may be used in a conventional through-silicon via configuration. For example, bond pad 40 may have a length that ranges from 70-110 micrometers and a width that ranges from 70-110 micrometers, or any other suitable dimensions for the bond pad.

Vias such as through-oxide vias 42 may be formed in image sensor die 22 and DSP die 24 to electrically connect bond pad 40 to the integrated circuits in the dies (e.g. image sensor integrated circuits and DSP integrated circuits). Through-oxide vias 42 may be formed from conductive material such as copper and any other suitable conductive material. Through-oxide vias 42 may be surrounded by via liners such as via liners 44 and may pass through STI structure 28. Via liners 44 may be formed from tantalum or any other suitable conductive materials. Via liners 44 may be surrounded by a passivation layer such as passivation layer 45. Passivation layer 45 may be formed from oxide material. Through-oxide via 42 may have one end that is connected to bond pad 40 and another end that extends through image sensor die 22 into DSP die 24. Through-oxide vias 42 may connect bond pad 40 to metal interconnects 36 and 38 while connecting the metal interconnects 36 and 38 to each other.

In this way, the bond pad connections and the inter-die connections (e.g. the connections between the metal interconnects in the first and second dies, such as metal interconnects 36 and 38) may be formed using a single structure and process (e.g. through-oxide vias) rather than separate processes and structures for the bond pad connections and the inter-die connections. The electrical connection between bond pad 40 and the circuitry in the first and second dies using through-oxide vias 42 rather than conventional through-silicon via methods may result in reducing bond pad area for bond pad 40 and the number of masking layers used during processing, which improves the amount of space and cost for manufacturing image sensor packages. A single etching process to form the bond pad connection and the inter-die connections may be desirable as it may improve the process integration (e.g. reduce development cycle time), minimize topography (e.g. improve yield of light reaching the photodiodes in the image sensor), and reduce the cost of the process.

Figure 3:
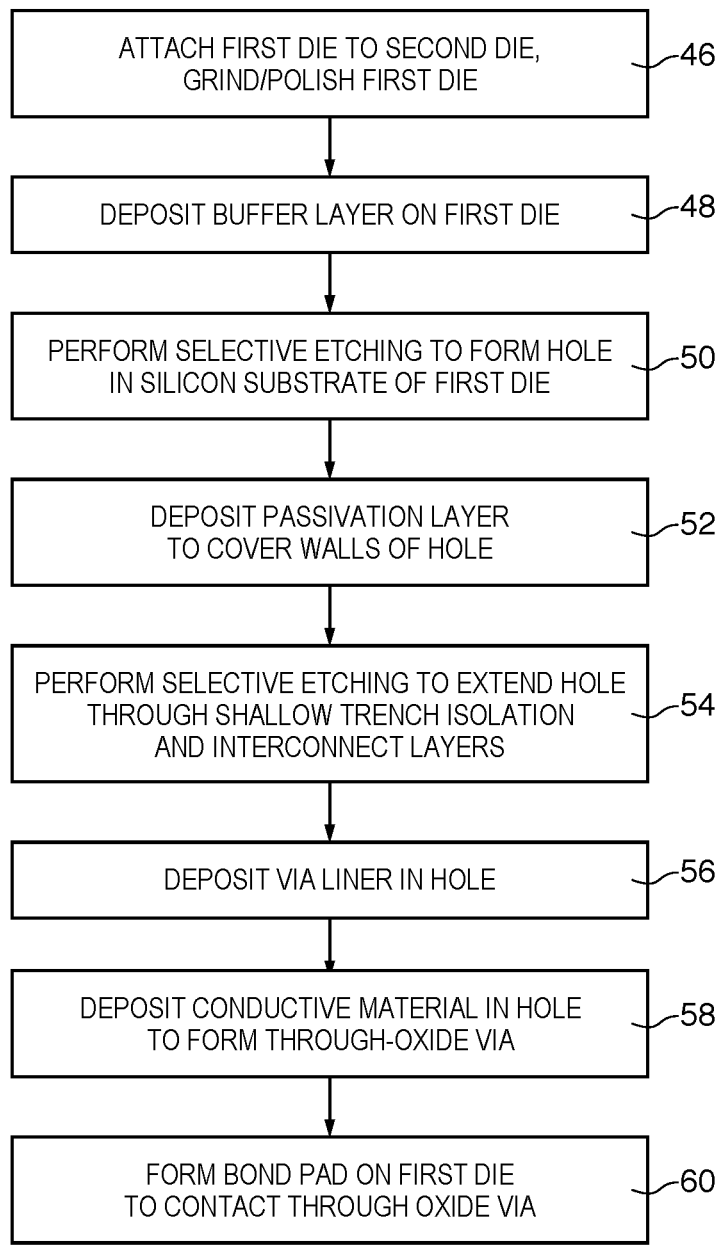
FIG. 3 is a flow chart showing illustrative steps that may be involved in forming an illustrative imaging system having through-oxide vias in accordance with an embodiment of the present invention.

FIG. 3 is a flow chart of illustrative steps that may be involved in forming an illustrative imaging system having through-oxide vias such as the image sensor package shown in FIG. 2.

At step 46, a first die such as image sensor die 22 and a second die such as DSP die 24 may be attached to each other and the image sensor die 22 may be ground or polished to a desired thickness. Image sensor die 22 may be bonded or attached to DSP die 24 such that their front side interconnect layers such as interconnect layers 32 and interconnect layers 34 face each other. Image sensor die 22 may include a silicon substrate such as silicon substrate 26 with an image sensor integrated circuit for the array of photodiodes in silicon substrate 26. The silicon substrate such as silicon substrate 26 may be ground and thinned to a desired thickness, which may range from 2-3 microns for backside illuminated image sensors.

At step 48, a buffer layer such as buffer layer 30 may be deposited on the first die such as image sensor die 22. The buffer layer may be formed from oxide materials and may be formed from multiple layers of materials. For example, an antireflective coating layer formed from oxide materials may be deposited on the first die and additional buffer layers also formed from oxide materials may be deposited over the first die and the antireflective coating layer.

At step 50, selective etching may be performed to form a hole in a silicon substrate of the first die, such as silicon substrate 26 of image sensor die 22. The hole may reach an STI structure in the silicon substrate, such as STI structure 28. The STI structure may be positioned between adjacent transistors in the silicon substrate to block and isolate the current flow from the transistors from each other.

At step 52, a passivation layer such as passivation layer 45 may be deposited in the hole such that the passivation layer covers the walls of the hole in the silicon substrate, such as silicon substrate 26. The passivation layer may be formed from oxide material.

At step 54, selective etching may be performed to extend the hole through an STI structure such as STI structure 28 and interconnect layers such as interconnect layers 36 and 38. The hole may extend through layers of metal routing paths in the interconnect layers such as metal interconnects 36 and 38. The hole may be etched such that the hole extends through the first die and into the second die (i.e. from the first die to the second die). The etching may be done in a single etching process or multiple etching processes. A single etching process may be desirable as it may improve the process integration (e.g. reduce development cycle time), minimize topography (e.g. improve yield of light reaching the photodiodes in the image sensor), and reduce the cost of the process.

At step 56, a via liner such as via liner 44 may be deposited in the hole. The via liner may be deposited such that the via liner lines the inner surfaces of the hole. Via liner 44 may be formed from tantalum or any other suitable materials.

At step 58, a conductive material such as copper may be deposited in the hole to form through-oxide vias such as through-oxide vias 42. The rest of the hole may be filled by the conductive material. Through-oxide vias 42 may be electrically coupled to metal interconnects 36 and 38.

At step 60, a bond pad such as bond pad 40 may be formed on the first die such as image sensor die 22 such that the bond pad contacts the through-oxide via. Bond pad 40 may be electrically coupled to both the first die and the second die with through-oxide via 42, since through-oxide via is connected to bond pad 40, the metal interconnects in the first die (e.g. metal interconnects 36), and the metal interconnects in the second die (e.g. metal interconnects 38). In this way, the bond pad connections and the inter-die connections (e.g. formed between metal interconnects 36 and 38) may be formed using a single structure and process (e.g. through-oxide vias) rather than separate processes and structures for the bond pad connections and the inter-die connections. The electrical connection between bond pad 40 and the metal routing paths in the first and second dies using through-oxide vias 42 rather than conventional through-silicon via methods may result in a smaller bond pad area for bond pad 40 and fewer buffer layers used, which improves the amount of space and cost for manufacturing image sensor packages.

Figure 4A:
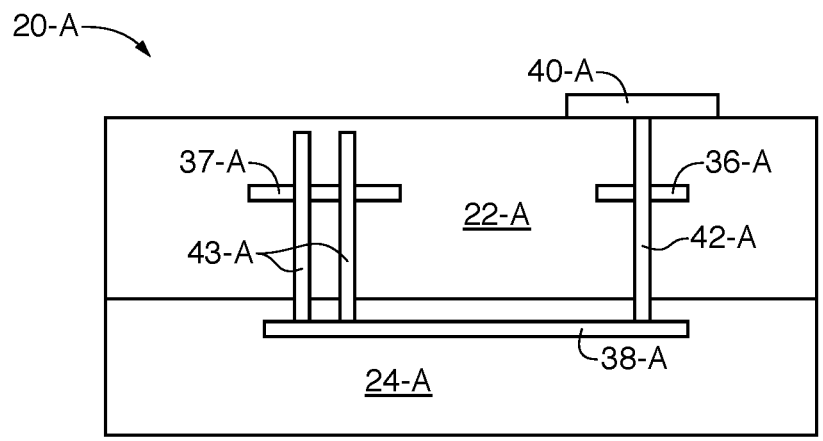
FIGS. 4A and 4B are cross-sectional side views of an image sensor package having through-oxide vias in accordance with an embodiment of the present invention.
Figure 4B:
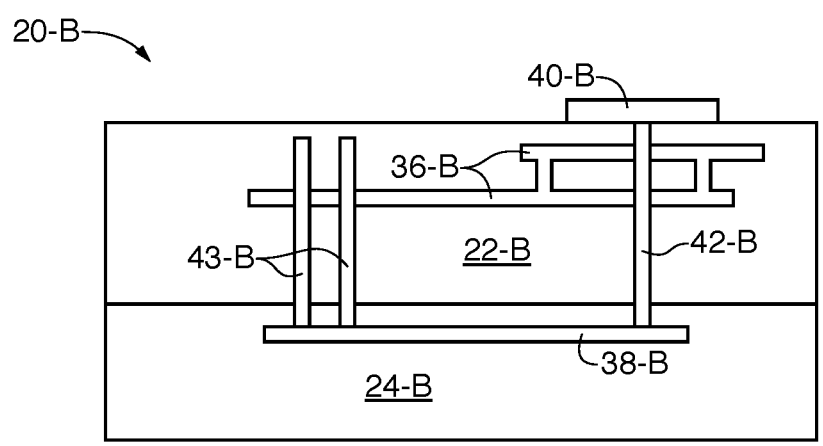

FIGS. 4A and 4B show cross-sectional views of various configurations of through-oxide vias that can be formed in an image sensor package. In FIG. 4A, an image sensor package such as image sensor package 20-A may have first and second dies such as image sensor die 22-A and DSP die 24-A. DSP die 24-A may include an application-specific integrated circuit (ASIC). Image sensor die 22-A may have metal interconnects 36-A and 37-A and DSP die 24-A may have metal interconnects 38-A. Metal interconnects 37-A may be coupled to one or more image sensor integrated circuits for an array of photodiodes (e.g. image sensor pixels 15 in FIG. 1) in image sensor die 22-A. Image sensor package 20-A may include vias 43-A which serve as inter-die connections that connect the metal interconnect 37-A in the first die to metal interconnect 38-A in the second die. Image sensor package 20-A may also include a through-oxide via such as through-oxide via 36-A and a bond pad such as bond pad 40-A that rests on a top surface of the image sensor die. Through-oxide via 42-A may be formed such that bond pad 40-A is simultaneously electrically coupled to metal interconnect 36-A and 38-A (e.g. through-oxide via 42-A may be both an inter-die connection between the first and second dies as well as a bond pad connection between bond pad 42-A and the metal interconnects 36-A and 38-A). However, since metal interconnect 36-A and metal interconnect 37-A are not electrically coupled, bond pad 40-A is not electrically coupled to metal interconnect 37-A and image sensor integrated circuits in image sensor die 22-A.

In FIG. 4B, an image sensor package such as image sensor package 20-B may have first and second dies such as image sensor die 22-B and DSP die 24-B. DSP die 24-B may include an application-specific integrated circuit (ASIC). Image sensor die 22-B may have metal interconnects 36-B and DSP die 24-B may have metal interconnects 38-A. Metal interconnects 36-B may be coupled to one or more image sensor integrated circuits for an array of photodiodes (e.g. image sensor pixels 15 in FIG. 1) in image sensor die 22-B. Image sensor package 20-B may also include a through-oxide via such as through-oxide via 36-A and a bond pad such as bond pad 40-B that rests on a top surface of the image sensor die. Through-oxide via 42-B may be formed such that bond pad 40-B is simultaneously electrically coupled to metal interconnect 36-B and 38-B (e.g. through-oxide via 42-B may be both an inter-die connection between the first and second dies as well as a bond pad connection between bond pad 42-A and the metal interconnects 36-A and 38-A). Bond pad 40-B may be electrically coupled to both metal interconnect 38-B in DSP die 24-B as well as pixel circuitry in image sensor die 22-A (through metal interconnect 36-B).

The configurations of through-oxide vias in FIGS. 4A and 4B are merely exemplary; there may be any suitable number of through-oxide vias that are formed in any suitable number of combinations to form any suitable connections between the bond pad and different layers of circuitry in the image sensor package.

Figure 5A:
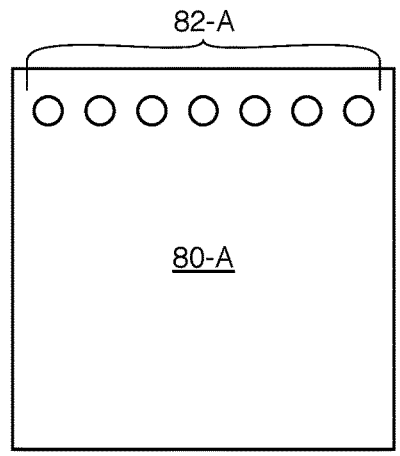
FIGS. 5A and 5B are top views of a bond pad with through-oxide vias in accordance with an embodiment of the present invention.
Figure 5B:
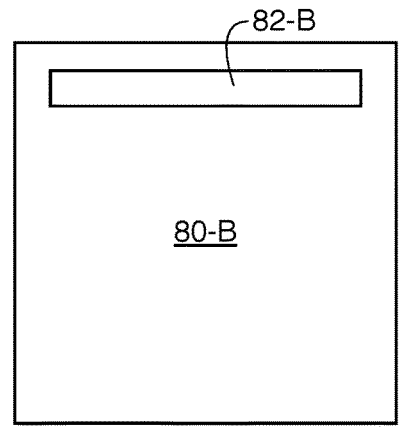

FIGS. 5A and 5B show various configurations of through-oxide vias that may be formed from a cut-away top view of a bond pad. As shown in FIG. 5A, bond pad 80-A may be formed from a conductive material such as aluminum. Bond pad 80-A may have top and bottom surfaces. The bottom surface of bond pad 80-A may be connected to and contact a number of through-oxide vias such as through-oxide vias 42 in FIGS. 2 and 4. The through-oxide vias 42 may be circular and there may be a plurality of through-oxide vias that contact bond pad 80-A along a side of the top surface. The arrangement in FIG. 5A is merely exemplary; any suitable number of and shape of through-oxide vias 42 may be formed in any suitable arrangement to connect to bond pad 80-A. Through-oxide vias 42 may be positioned adjacent to each other. The spacing between the vias 42 may be around 4.4 micrometers or any other suitable distance. Bond pad 80-A may have an area that is smaller than that of a bond pad that may be used in a conventional through-silicon via configuration. For example, bond pad 80-A may have a length that ranges from 70-110 micrometers and a width that ranges from 70-110 micrometers, or any other suitable dimensions for the bond pad.

As shown in FIG. 5B, bond pad 80-B may be formed from a conductive material such as aluminum. Bond pad 80-B may have top and bottom surfaces. The bottom surface of bond pad 80-B may be connected to and contact a number of through-oxide vias such as through-oxide vias 42 in FIGS. 2 and 4. Through-oxide vias 42 may be formed from a rectangular slot shaped opening in the silicon substrate and may be formed from a rectangular block of conductive material. A slot-shaped through-oxide via 42 may be connected to bond pad 80-B at one of the via's rectangular sides (shown in FIG. 5B). The arrangement shown in FIG. 5B is merely exemplary; the via may contact the bond pad in any suitable location. The slot-shaped via 42 may be 52 micrometers by 3.8 micrometers or have any other suitable ranges of dimensions. Bond pad 80-B may have an area that is smaller than that of a bond pad that may be used in a conventional through-silicon via configuration. For example, bond pad 80-B may have a length that ranges from 70-110 micrometers and a width that ranges from 70-110 micrometers, or any other suitable dimensions for the bond pad.

Figure 6:
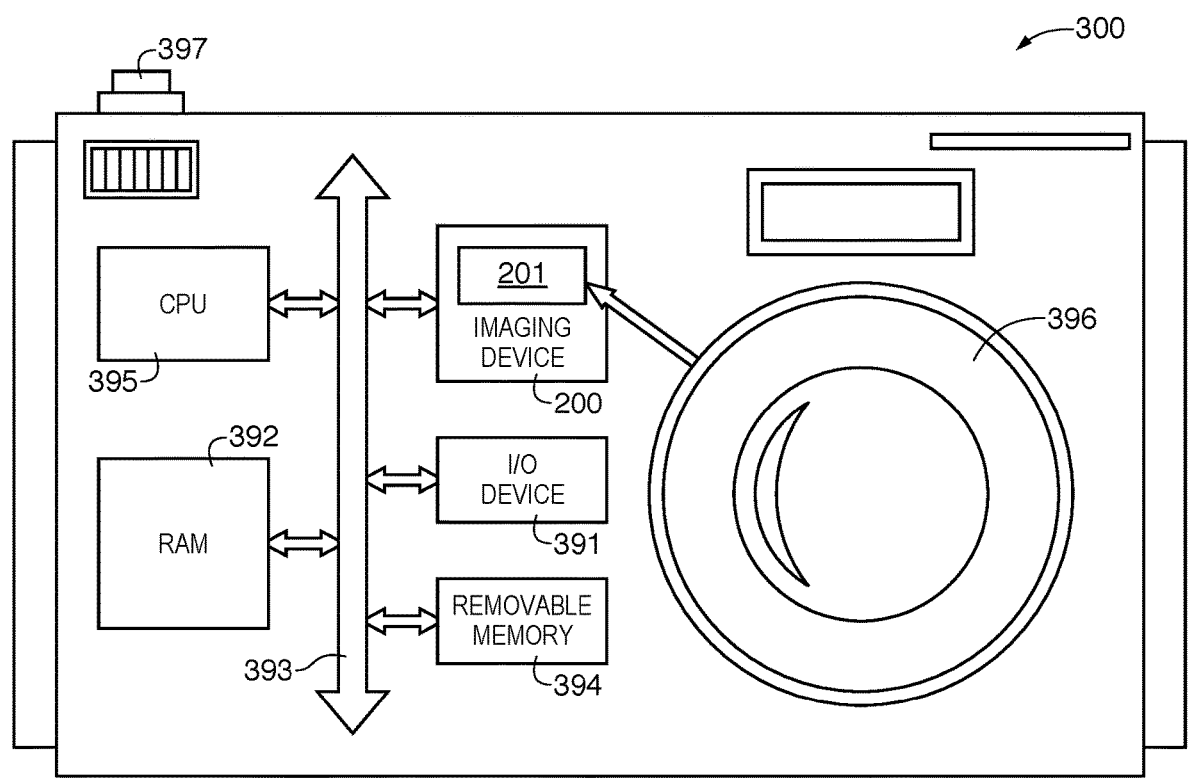
FIG. 6 is a block diagram of a system employing the embodiments of FIGS. 2-5 in accordance with an embodiment of the present invention.

FIG. 6 shows in simplified form a typical processor system 300, such as a digital camera, which includes an imaging device 200. Imaging device 200 may include a pixel array 201. Imaging device 200 may include an image sensor package such as image sensor package 20 with through-oxide vias 42 as shown in FIG. 2. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having bond pads connected to various dies in the imaging system using through-oxide vias. A system with a central processing unit, memory, and input-output circuitry may include an imaging device. The imaging device, or integrated circuit package, may include a first integrated circuit die, a second integrated circuit die that is attached or bonded to the first integrated circuit die, a bond pad on the first integrated circuit die; and a via that couples the bond pad on the first integrated circuit die to the second integrated circuit die. The via may have a first end that is connected to the bond pad and a second end that extends into the second integrated circuit die. The first and second integrated circuit dies may have first and second metal interconnects (also referred to as metal routing paths). The via may couple the first metal interconnect to the second metal interconnect. The first integrated circuit die may include a shallow trench isolation structure. The via may be formed through the shallow trench isolation structure. The first integrated circuit die may include an image sensor integrated circuit and the second integrated circuit die may include a digital signal processing integrated circuit. A via liner may surrounds the via. The via may be one of a plurality of vias that is formed through the first integrated circuit die and that contacts the bond pad. The vias may be circular or rectangular slots. The first integrated circuit may include an image sensor pixel that is coupled to the via through the metal routing paths in the first integrated circuit.

The via may be formed by performing selective etching to form a hole that extends into the first and second dies, depositing conductive material in the hole to form a via in the hole, and forming the bond pad on the first die to contact the via. The via may simultaneously provide a first connection between the first die and the second die and a second connection between the bond pad and the first die. A buffer layer may be deposited on the first die prior to performing selective etching. The first die includes a silicon substrate. Selective etching to form the hole may include performing selective etching to form the hole through the silicon substrate. A passivation layer may be deposited in the hole in the silicon substrate after performing selective etching to form the hole in the silicon substrate. The hole in the silicon substrate may then be formed through the shallow trench isolation structure in the first die and extended into the second die by selective etching.

The foregoing is merely illustrative of the principles of this invention which can be practiced in other embodiments.

What is to be claimed:

1. An image sensor package comprising:
an image sensor die having first and second opposing surfaces;
a metal structure on the first surface of the image sensor die;
a signal processing die bonded to the second surface of the image sensor die; and
a through-oxide via that extends through the image sensor die and into the signal processing die, wherein the through-oxide via electrically connects the signal processing die to the metal structure.

2. The image sensor package defined in claim 1, wherein the metal structure is a bond pad, and wherein the image sensor die comprises pixel circuitry electrically connected to the bond pad.

3. The image sensor package defined in claim 2, wherein the signal processing die comprises metal interconnects that are electrically connected to the bond pad by the through-oxide via.

4. The image sensor package defined in claim 1, wherein the image sensor die comprises a silicon substrate, and wherein the through-oxide via extends through the silicon substrate.

5. The image sensor package defined in claim 4, wherein the silicon substrate includes a hole that is at least partially filled with oxide material, and wherein the through-oxide via extends through the oxide material.

6. The image sensor package defined in claim 1, wherein the image sensor die comprises a shallow trench isolation structure, and wherein the through-oxide via extends through the shallow trench isolation structure.

7. A system, comprising:
a central processing unit;
memory;
input-output circuitry; and
an imaging device, wherein the imaging device comprises:
a first integrated circuit die, wherein the first integrated circuit die comprises an image sensor integrated circuit die and wherein the image sensor integrated circuit die comprises:
a silicon substrate having an opening; and
an oxide layer that overlaps the silicon substrate and at least partially fills the opening;
a second integrated circuit die bonded to the first integrated circuit die, wherein the second integrated circuit die comprises a signal processing integrated circuit die; and
a through-oxide via that extends through the first integrated circuit die and into the second integrated circuit die to electrically connect the first integrated circuit die to the second integrated circuit die.

8. The system defined in claim 7, wherein the through-oxide via extends through the opening in the silicon substrate and through the oxide layer that at least partially fills the opening.

9. The system defined in claim 8, wherein the image sensor integrated circuit die comprises a first metal interconnect and the signal processing integrated circuit die comprises a second metal interconnect, the imaging device further comprising:
a bond pad on the image sensor integrated circuit die, wherein the through-oxide via electrically connects the bond pad, the first metal interconnect, and the second metal interconnect.

10. A system, comprising:
a first integrated circuit die that includes a first interconnect layer;
a second integrated circuit die that is attached to the first integrated circuit die and that includes a second interconnect layer;
a metal structure on the first integrated circuit die; and
a through-oxide via that extends into the first integrated circuit die and into the second integrated circuit die, that connects to the metal structure, and that connects the first interconnect layer of the first integrated circuit die to the second interconnect layer of the second integrated circuit die.

11. The system defined in claim 10, wherein the metal structure comprises a bond pad and wherein the through-oxide via has a first end that is connected to the bond pad and a second end that is connected to the second interconnect layer of the second integrated circuit die.

12. The system defined in claim 10, wherein the first integrated circuit die includes a shallow trench isolation structure, and wherein the through-oxide via is formed through the shallow trench isolation structure.

13. The system defined in claim 10, wherein the first integrated circuit die comprises an image sensor integrated circuit, and wherein the second integrated circuit die comprises a digital signal processing integrated circuit.

14. The system defined in claim 10, wherein the first interconnect layer of the first integrated circuit die is interposed between a substrate of the first integrated circuit die and the second interconnect layer of the second integrated circuit die.

* * * * *